(12) United States Patent
Kwag et al.

(10) Patent No.: US 11,348,821 B2
(45) Date of Patent: May 31, 2022

(54) LASER TRANSFER APPARATUS AND TRANSFER METHOD USING I HE SAME

(71) Applicant: SAMSUNG ELECTRONICS CO., LTD., Suwon-si (KR)

(72) Inventors: Doyoung Kwag, Suwon-si (KR); Byungchul Kim, Suwon-si (KR); Sangmoo Park, Suwon-si (KR); Minsub Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

(21) Appl. No.: 16/929,311

(22) Filed: Jul. 15, 2020

(65) Prior Publication Data

US 2021/0057258 A1 Feb. 25, 2021

(30) Foreign Application Priority Data

Aug. 23, 2019 (KR) .................. 10-2019-0103482

(51) Int. Cl.
*H01L 21/683* (2006.01)
*B23K 26/03* (2006.01)
(Continued)

(52) U.S. Cl.
CPC .......... *H01L 21/6835* (2013.01); *B23K 26/03* (2013.01); *B23K 26/0344* (2015.10);
(Continued)

(58) Field of Classification Search
CPC ........... H01L 21/6835; H01L 21/67144; H01L 25/0753; H01L 27/1214; H01L 33/62;
(Continued)

(56) References Cited

U.S. PATENT DOCUMENTS 5,699,146 A 12/1997 Kaminaga
7,526,858 B2 5/2009 Kasuga et al.
(Continued)

FOREIGN PATENT DOCUMENTS

CN 109524512 A 3/2019
JP 2008053698 A 3/2008
(Continued)

OTHER PUBLICATIONS

Communication dated Jan. 25, 2021, issued the European Patent Office in European Application No. 20190130.3.
(Continued)

*Primary Examiner* — Vu A Vu
(74) *Attorney, Agent, or Firm* — Sughrue Mion, PLLC

(57) ABSTRACT

The application is related to a laser transfer apparatus and a method performed by the laser transfer apparatus. The laser transfer apparatus may include: a laser oscillator configured to perform irradiation with a laser beam; a first stage movably disposed below the laser oscillator; a second stage movably disposed below the first stage; a flatness measurement sensor; and a controller. The controller may be configured to control, once a transfer substrate on which a plurality of light emitting diodes (LEDs) are arranged is loaded on the first stage, and a target substrate is loaded on the second stage, the flatness measurement sensor to measure flatness of each of the transfer substrate and the target substrate, and adjust a height of at least one of the first stage or the second stage based on the flatness.

20 Claims, 8 Drawing Sheets

(51) Int. Cl.
  *B23K 26/04* (2014.01)
  *B23K 26/08* (2014.01)
  *H01L 21/67* (2006.01)
  *H01L 25/075* (2006.01)
  *H01L 27/12* (2006.01)
  *H01L 33/62* (2010.01)

(52) U.S. Cl.
  CPC ........ *B23K 26/048* (2013.01); *B23K 26/0861* (2013.01); *H01L 21/67144* (2013.01); *H01L 25/0753* (2013.01); *H01L 27/1214* (2013.01); *H01L 33/62* (2013.01); *H01L 2221/68354* (2013.01); *H01L 2221/68363* (2013.01); *H01L 2221/68381* (2013.01); *H01L 2933/0066* (2013.01)

(58) Field of Classification Search
  CPC . H01L 2221/68354; H01L 2221/68363; H01L 2221/68381; H01L 2933/0066; H01L 33/0095; H01L 21/67781; H01L 21/268; H01L 21/67259; H01L 33/00; H01L 21/52; H01L 22/12; B23K 26/0344; B23K 26/03; B23K 26/048; B23K 26/0861; B23K 26/362; B23K 26/064; G01B 11/306
  USPC .......................................................... 438/28
  See application file for complete search history.

(56) References Cited

U.S. PATENT DOCUMENTS

| | | | |
|---|---|---|---|
| 7,994,021 B2 | 8/2011 | Miyairi et al. | |
| 8,361,268 B2 * | 1/2013 | Mizuno | H01L 21/268 |
| | | | 156/249 |
| 8,462,331 B2 | 6/2013 | Ryu et al. | |
| 8,703,579 B2 | 4/2014 | Miyairi et al. | |
| 8,734,701 B2 * | 5/2014 | Kawakami | B82Y 40/00 |
| | | | 264/293 |
| 9,240,397 B2 * | 1/2016 | Bibi | H01L 33/52 |
| 2008/0026543 A1 | 1/2008 | Miyairi et al. | |
| 2010/0258543 A1 | 10/2010 | Mizuno et al. | |
| 2011/0275191 A1 | 11/2011 | Miyairi et al. | |
| 2015/0214085 A1 | 7/2015 | Jin et al. | |
| 2015/0287625 A1 | 10/2015 | Fujimoto et al. | |
| 2016/0336233 A1 | 11/2016 | Yonehara et al. | |
| 2017/0236811 A1 | 8/2017 | Pokhriyal et al. | |
| 2018/0136572 A1 | 5/2018 | Matsumoto | |
| 2018/0166429 A1 | 6/2018 | Chong et al. | |
| 2018/0366450 A1 | 12/2018 | Gardner et al. | |
| 2019/0043843 A1 | 2/2019 | Liu et al. | |
| 2019/0088516 A1 | 3/2019 | Zhu et al. | |
| 2020/0243708 A1 | 7/2020 | Yanagawa et al. | |

FOREIGN PATENT DOCUMENTS

| | | |
|---|---|---|
| JP | 2013-16570 A | 1/2013 |
| JP | 6212536 B2 | 10/2017 |
| JP | 2019-83280 A | 5/2019 |
| KR | 1020150073526 A | 7/2015 |
| KR | 10-2018-0016101 A | 2/2018 |

OTHER PUBLICATIONS

International Search Report (PCT/ISA/210) and Written Opinion (PCT/ISA/237) dated Oct. 22, 2020 issued by the International Searching Authority in International Application No. PCT/KR2020/008983.

* cited by examiner

LASER TRANSFER APPARATUS AND TRANSFER METHOD USING I HE SAME

CROSS-REFERENCE TO RELATED APPLICATION(S)

This application is based on and claims priority under 35 U.S.C. § 119 to Korean Patent Application No. 10-2019-0103482, filed on Aug. 23, 2019, in the Korean Intellectual Property Office, the disclosure of which is incorporated by reference herein in its entirety.

BACKGROUND

Field

The disclosure is related to a laser transfer apparatus and a transfer method using the same, and more particularly, to a laser transfer apparatus that performs laser beam scanning on a transfer substrate to transfer a light emitting diode (LED) to a target substrate, and a transfer method using the same.

Description of the Related Art

In general, a light emitting diode (LED) may be formed on a wafer and transferred to a substrate through a transfer process.

With development of technologies, the LED may be manufactured in a small size of a micro unit. Further, a method of transferring a large number of LEDs (e.g., a large number of micro LEDs) to a substrate within a short period of time has been suggested.

Such a transfer process may be a process in which the LED is transferred from one substrate to another substrate, and may include a process in which the LED is transferred from the wafer to the transfer substrate or to a module substrate (hereinafter, referred to as "target substrate") utilized for a product, or a process in which the LED is transferred from the transfer substrate to the target substrate.

The transfer substrate may be a wafer on which the LED is formed, or a relay substrate on which the LED separated from the wafer is arranged and fixed.

In case that the relay substrate is the transfer substrate, a plurality of LEDs may be fixed by an adhesive layer.

In a laser transfer method, the transfer substrate may be positioned above the target substrate at a predetermined interval, and then the transfer substrate may be irradiated with a laser beam. In this case, a chemical change occurs in the adhesive layer of the transfer substrate to which an LED to be transferred may be fixed, such that the LED may be separated from the transfer substrate and transferred to the target substrate.

However, the transfer substrate and the target substrate may frequently be exposed to high temperature during a manufacturing process, and thus may warp. Due to such a warpage, flatness of each of the transfer substrate and the target substrate may deteriorate. The flatness of each of the transfer substrate and the target substrate affects an accurate transfer of an LED, such as a micro LED having a size of a micro unit to a position.

In case that a laser transfer is performed by using a transfer substrate with poor flatness, multiple points of an adhesive layer of the transfer substrate to which a plurality of LEDs are attached are out of a depth of field (DOF) of laser. The DOF may refer to an area on which the laser is focused at a certain level or higher.

Therefore, the adhesive layer that is out of the DOF of the laser is not melted by the laser or only a part of the adhesive layer is melted. As a result, the LED is not properly separated from the transfer substrate and is not accurately transferred to a predetermined transfer position on the target substrate, which is problematic.

SUMMARY

Embodiments of the disclosure overcome the above disadvantages and other disadvantages not described above. Also, the disclosure is not required to overcome the disadvantages described above, and an embodiment of the disclosure may not overcome any of the problems described above.

According to an embodiment, a laser transfer apparatus may accurately transfer an LED to a transfer position on a target substrate by controlling a position of a transfer substrate to position each point of the transfer substrate to which the LED is attached within a depth of field of laser and controlling a position of the target substrate based on the position of the transfer substrate.

According to an embodiment of the disclosure, a laser transfer apparatus may include: a laser oscillator configured to perform irradiation with a laser beam; a first stage movably disposed below the laser oscillator; a second stage movably disposed below the first stage; a flatness measurement sensor; and a controller. The controller may be configured to control, once a transfer substrate on which a plurality of light emitting diodes (LEDs) are arranged is loaded on the first stage, and a target substrate is loaded on the second stage, the flatness measurement sensor to measure flatness of each of the transfer substrate and the target substrate, and is configured to adjust a height of at least one of the first stage or the second stage based on the flatness.

The controller may be configured to move the first and second stages to move the transfer substrate and the target substrate to transferring positions, respectively, and may be configured to predict arrival times of the first and second stages at the transferring positions based on moving speeds of the first and second stages, respectively, to control a laser irradiation timing of the laser oscillator.

The flatness measurement sensor may measure the flatness of the transfer substrate by measuring a distance from an arbitrarily set reference position to each of points of the transfer substrate, at which the plurality of LEDs are disposed, and measure the flatness of the target substrate by measuring a distance from an arbitrarily set reference position to each of points of the target substrate, to which the plurality of LEDs are to be transferred.

The controller may be configured to adjust the height of the first stage by calculating a relative position of a point of the transfer substrate, to which each of the LEDs is attached, with respect to a depth of field (DOF) of laser irradiated from the laser oscillator.

The controller may be configured to calculate three-dimensional coordinates of a transferring position of each of the first and second stages based on the flatness of each of the transfer substrate and the target substrate, and move at least one of the first stage or the second stage based on the three-dimensional coordinates.

According to an embodiment of the disclosure, a transfer method using a laser transfer apparatus may include: measuring, once a transfer substrate and a target substrate are loaded on a first stage and a second stage, respectively, flatness of each of the transfer substrate and the target substrate; moving the first stage and the second stage to transferring positions, respectively; adjusting a height of at least one of the first stage or the second stage based on the flatness; and transferring a plurality of LEDs arranged on the transfer substrate to the target substrate by irradiating the transfer substrate with laser.

The transfer method may further include obtaining a first stage height adjusting parameter for positioning a laser irradiation point of the transfer substrate within a depth of field (DOF) of the laser, wherein in the adjusting of the height, the height of the first stage is adjusted based on the first stage height adjusting parameter.

The transfer method may further include obtaining a second stage height adjusting parameter for maintaining a predetermined interval between an LED mounting point of the target substrate, and the transfer substrate, wherein in the adjusting of the height, the height of the second stage is adjusted based on the second stage height adjusting parameter.

The transfer method may further include setting three-dimensional coordinates of the transferring position of each of the transfer substrate and the target substrate based on the measured flatness.

In the driving of the first stage, the first stage may be moved to position a laser irradiation point of the transfer substrate within a DOF of the laser at the transferring position.

The transfer method may further include predicting arrival times of the first and second stages at the transferring positions based on moving speeds of the first and second stages, respectively, to control a laser irradiation timing.

According to another embodiment of the disclosure, a computer-readable recording medium includes a program for executing a method of transferring LEDs to a target substrate by controlling a laser transfer apparatus, the method including: measuring flatness of each of a transfer substrate and the target substrate loaded on a first stage and a second stage, respectively; driving the first stage to position the transfer substrate within a DOF of a laser beam at a transferring position based on the measured flatness; driving the second stage to maintain a predetermined interval from the transfer substrate that is moved to the transferring position; controlling an irradiation timing of laser output from a laser oscillator by predicting arrival times of the first and second stages at the transferring positions based on moving speeds of the first and second stages, respectively.

According to an embodiment of the disclosure, the transfer substrate loaded on the first stage may be disposed in a form in which the plurality of LEDs face the target substrate positioned below the transfer substrate. According to an embodiment of the disclosure, the target substrate may be loaded on the second stage and may be disposed in a form in which a thin film transistor (TFT) layer to which the LEDs are transferred face the transfer substrate.

According to an embodiment of the disclosure, a laser transfer apparatus may include: one or more flatness measurement sensors; and a processor configured to: obtain, from the one or more flatness measurement sensors, measured flatness information regarding flatness of each of a wafer and a target substrate, respectively, wherein the wafer holds a micro light emitting diode (LED) and the target substrate is located below the wafer which is located below an irradiation system; and set three-dimensional (3D) coordinates of transferring positions of the wafer and the target substrate based on the measured flatness information, wherein the first stage holds the wafer and the second stage holds the target substrate.

The processor may be further configured to: control, based on the flatness of the transfer substrate, a position of the transfer substrate to position each point of an adhesive layer of the transfer substrate to which a micro LED is attached within a depth of field (DOF) of a laser of the irradiation system.

The processor may be further configured to: control, based on the transferring position of the transfer substrate, a position of the target substrate to maintain a predetermined interval between the target substrate and the transfer substrate.

The laser transfer apparatus may further comprise one or more speed sensors configured to detect moving speeds of one or more of the first stage or the second stage, and the processor may be further configured to: obtain, from the one or more speed sensors, one or more moving speeds of at least one of the first stage or the second stage, in real time, and control a laser irradiation timing at which the transfer substrate is to be irradiated with a laser of the irradiation system.

According to an embodiment, the wafer loaded on the first stage may be disposed in a form in which the LED faces the target substrate positioned below the wafer.

According to an embodiment, the target substrate may be loaded on the second stage and may be disposed in a form in which a thin film transistor (TFT) layer to which the LEDs are transferred face the wafer.

Additional and/or other aspects and advantages of the disclosure will be set forth in part in the description which follows and, in part, will be obvious from the description, or may be learned by practice of the disclosure.

BRIEF DESCRIPTION OF THE DRAWINGS

The above and/or other aspects of the disclosure will be more apparent by describing certain embodiments of the disclosure with reference to the accompanying drawings, in which.

DETAILED DESCRIPTION

Figure 1:
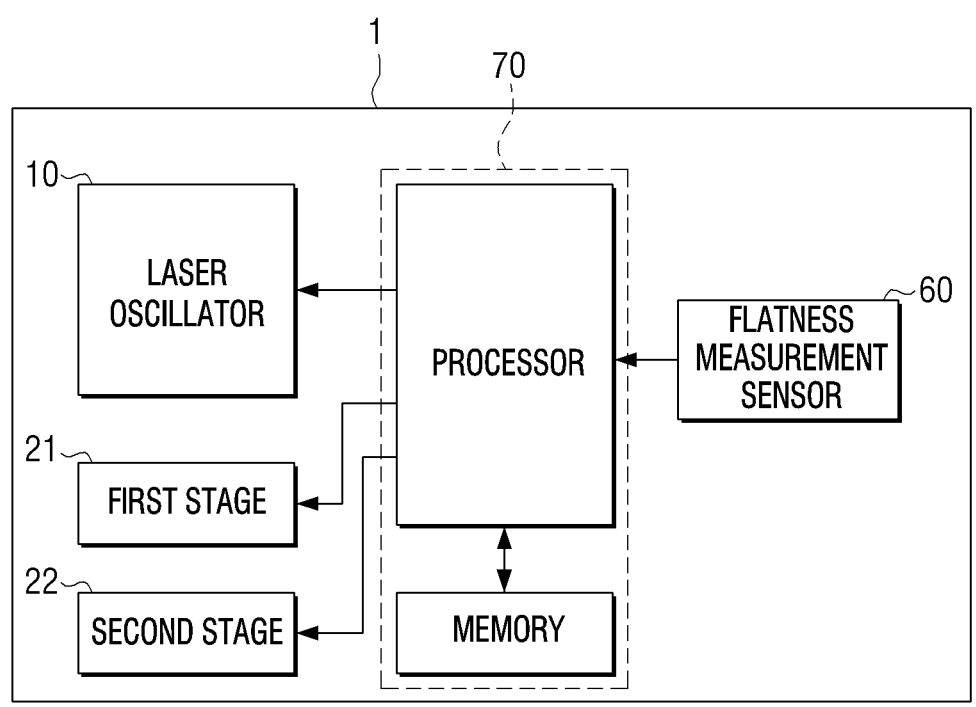
FIG. 1 is a block diagram illustrating a laser transfer apparatus according to an embodiment of the disclosure.

In order to allow full understanding configurations and effects according to the disclosure, various embodiments of the disclosure will be described with reference to the accompanying drawings. The disclosure may, however, be embodied in many different forms and should not be construed as limited to the embodiments set forth herein, and various modifications may be made. It should be understood, however, that the description of the embodiments is provided to enable the disclosure of the disclosure to be complete, and will fully convey the scope of the disclosure to a person having ordinary skill in the art to which the disclosure pertains. In the accompanying drawings, the constituent elements are enlarged in size for convenience of explanation and the proportion of each constituent element may be exaggerated or reduced.

Unless otherwise defined, all terms used in the disclosure have the same meaning as commonly understood by a person having ordinary skills in the art to which the disclosure pertains.

A display module including a plurality of LEDs to be transferred according to the disclosure may include one or more or all of: a thin film transistor (TFT) layer formed on one surface, a substrate having one surface on which the TFT layer is formed, the plurality of LEDs arranged in a state of electrically connected to the TFT layer, and/or a wiring electrically connecting circuits arranged on a back surface of the substrate. Here, the substrate may be a transparent substrate (e.g., a glass substrate, a quartz substrate, or the like), and may be referred to as a backplane. Further, a substrate including a TFT layer may be referred to as a "TFT substrate", a "TFT backplane", or a "target substrate", and these terms may be used interchangeably in the disclosure.

In the disclosure, a substrate in which a TFT layer (or backplane) is stacked on a glass substrate may be referred to as a TFT substrate. The TFT substrate is not limited to a specific structure or type. For example, the TFT substrate, according to an embodiment, may be implemented by a low temperature polycrystalline silicon (LTPS) TFT substrate, an oxide TFT substrate, a Si TFT (polysilicon or a-silicon) substrate, an organic TFT substrate, a graphene TFT, or the like, or, for example, only a P-type (or N-type) metal oxide semiconductor field effect transistor (MOSFET) may be produced in a Si wafer complementary metal oxide semiconductor (CMOS) process and applied.

According to an embodiment, the display module may include a separate substrate (which may be disposed behind the target substrate and, hereinafter, referred to as "back substrate" in consideration of such disposition) electrically connected to a back surface of the target substrate through a flexible printed circuit (FPC). Here, the back substrate may be formed in a thin film form or a thin glass form having several tens μm (for example, 50 μm or less). In case that the back substrate is formed in a thin film form, the back substrate may be formed of at least one of plastic materials such as one or more of: polyimide (PI), polyethylene terephthalate (PET), polyethersulfone (PES), polyethylene naphthalate (PEN), and/or polycarbonate (PC).

According to an embodiment, the target substrate may have an edge portion on which a side wiring is formed, and a first connection pad and a second connection pad may be electrically connected to each other by the side wiring. According to an embodiment, the first connection pad may be formed on an edge portion of a front surface of the target substrate, and the second connection pad may be formed on a back surface of the target substrate. To this end, according to an embodiment, the side wiring may be continuously formed along the front surface, a side surface, and the back surface of the target substrate. The side wiring may have one end electrically connected to the first connection pad, and the other end electrically connected to the second connection pad. Here, the side wiring is partially formed on the side surface of the target substrate, and thus may protrude from the side surface of the target substrate by a thickness of the side wiring. In this case, the first connection pad may be electrically connected to a TFT circuit formed in the TFT layer through a wiring. The second connection pad may be electrically connected to the back surface through the FPC. A driving integrated circuit (IC) mounted on the back surface of the target substrate may be directly connected to the second connection pad or indirectly connected to the second connection pad through a separate wiring. A number of display modules configured as described above may be arranged, such as in a tiled manner, to manufacture a large-sized display apparatus.

According to an embodiment, the LED may have a size of 100 μm or less. As an example, the LED may have a size of 30 μm or less. Such an LED may be a semiconductor chip that is formed of an inorganic light emitting material and is capable of emitting light by itself in a case where power is supplied. Further, the LED may be a flip chip type LED having one surface on which an anode and a cathode are formed, and emitting light from a surface that is opposite to the one surface on which the anode and the cathode are formed.

According to an embodiment, a display module including a micro light emitting diode (micro LED or μLED) may be a flat display panel. The micro LED may be an inorganic LED having a size of 100 μm or less. As compared with a liquid crystal display (LCD) panel requiring a backlight, the display module including the micro LED as described above may offer better contrast, response times, and energy efficiency. The organic LED (OLED) and the micro LED which is an inorganic light emitting element both have excellent energy efficiency, but the micro LED offers higher brightness, better light emitting efficiency, and longer life, in comparison to the OLED.

According to an embodiment, in the display module, a black matrix may be formed between a plurality of micro LEDs arranged on the TFT layer. The black matrix may improve a contrast ratio by preventing leakage of light from a peripheral portion of adjacent micro LEDs.

According to an embodiment, a laser transfer apparatus may measure flatness of each of the transfer substrate and the target substrate with poor flatness caused by a warpage, and may set three-dimensional coordinates of transferring positions of the transfer substrate and the target substrate based on the measured flatness of each substrate.

According to an embodiment, the laser transfer apparatus may control, based on the flatness of the transfer substrate, a position of the transfer substrate to position each point of an adhesive layer of the transfer substrate to which an LED is attached within a depth of field (DOF) of laser at the time of a transfer.

According to an embodiment, the laser transfer apparatus may control, based on the transferring position of the transfer substrate, a position of the target substrate to maintain a predetermined interval between the target substrate and the transfer substrate.

According to an embodiment, the laser transfer apparatus may detect moving speeds of stages on which the transfer substrate and the target substrate are loaded, respectively, in real time, and control a laser irradiation timing at which the transfer substrate is to be irradiated with the laser.

According to an embodiment, a glass substrate in which an LED having a size of a micro unit is mounted and a side wiring is formed may be referred to as display module. Such a display module may be installed in and applied to a wearable device, a portable device, a handheld device, and various electronic products or electric parts requiring a display, as a single unit. Further, a plurality of display modules may be assembled in a matrix form and applied to a display apparatus such as a monitor for a personal computer (PC), a high-resolution TV, a signage (or digital signage), or an electronic display.

Hereinafter, a laser transfer apparatus according to an embodiment of the disclosure will be described in detail with reference to the drawings.

Figure 2:
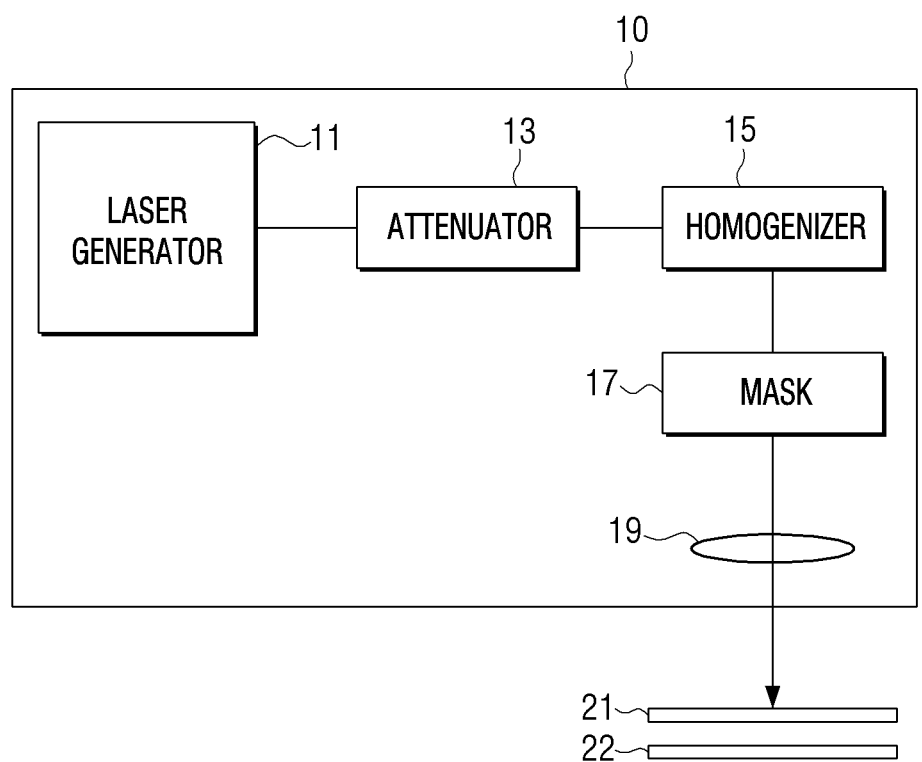
FIG. 2 is a block diagram illustrating a laser oscillator of the laser transfer apparatus according to the embodiment of the disclosure.

FIG. 1 is a block diagram illustrating the laser transfer apparatus according to the embodiment of the disclosure, and FIG. 2 is a block diagram illustrating a laser oscillator of the laser transfer apparatus according to the embodiment of the disclosure.

Referring to FIG. 1, a laser transfer apparatus 1 may include a laser oscillator 10, a first stage 21, a second stage 22, a flatness measurement sensor 60, and a controller 70.

The laser oscillator 10 may be a component for irradiating the transfer substrate with a laser beam to transfer an LED to a target substrate. The first stage 21 may be a component for loading the transfer substrate and moving the transfer substrate to a predetermined position, and the second stage 22 may be a component for loading a target substrate and moving the target substrate to a predetermined position.

According to an embodiment, the flatness measurement sensor 60 may be a sensor for measuring flatness of each of one or more of the transfer substrate and the target substrate. The flatness measurement sensor 60 may also include more than one sensor (e.g., a transfer substrate flatness measurement sensor, and a target substrate flatness measurement sensor). A method of measuring the flatness will be described later.

The controller 70 may be a component for controlling an operation of each component of the laser transfer apparatus 1 to perform a transfer. The controller 70 may be implemented in an integrated circuit form or a system-on-a-chip (SoC) form, or may be implemented to include a memory and a processor as illustrated in FIG. 1. The memory may store various data and instructions. The processor may execute the instructions stored in the memory to perform transfer methods according to various embodiments described in the disclosure. For convenience of explanation, in the disclosure, a case where the controller performs the transfer method will be described.

Figure 7:
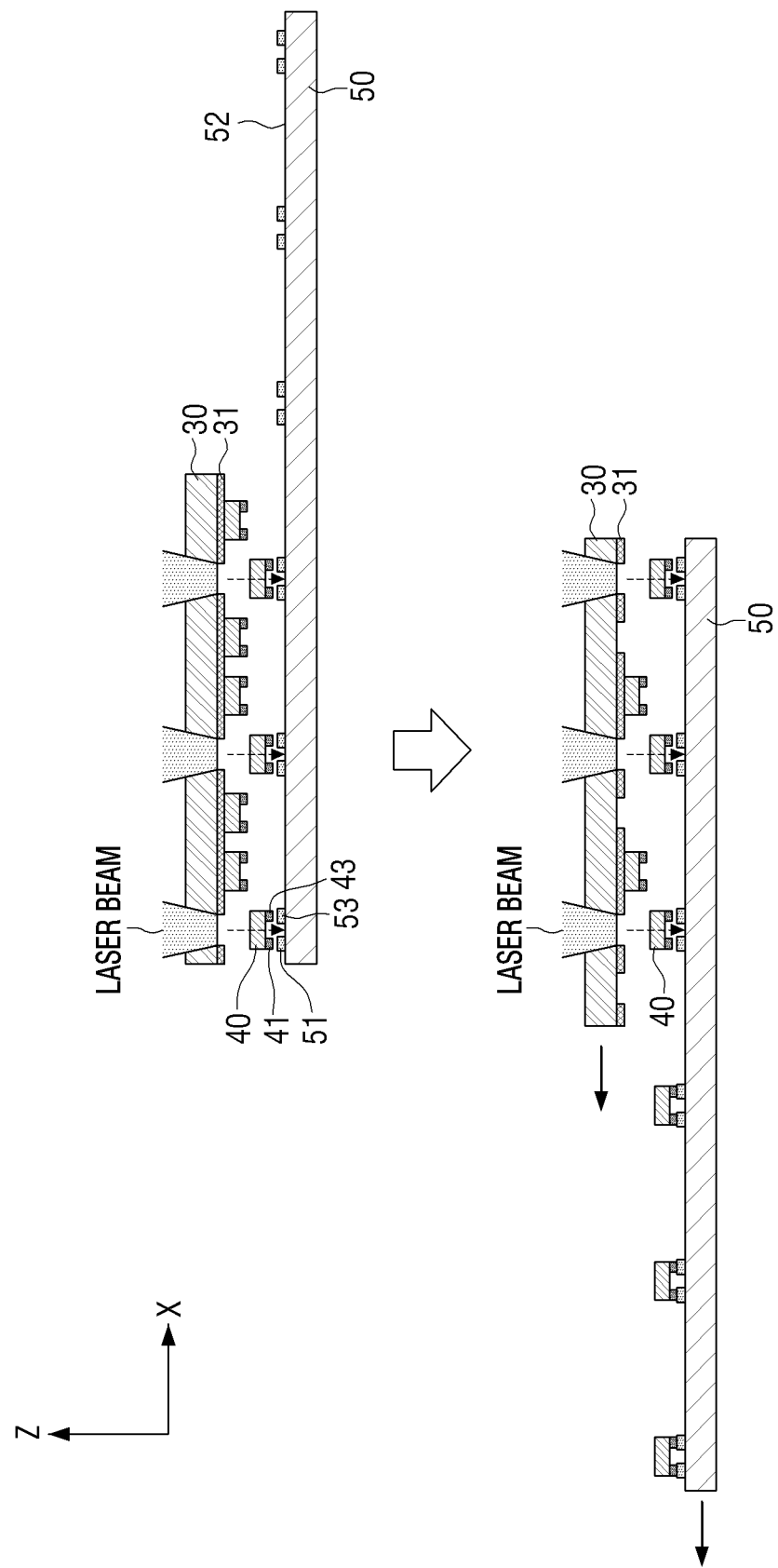
FIG. 7 is a diagram illustrating a process of transferring a plurality of light emitting diodes (LEDs) from the transfer substrate to the target substrate with the laser transfer apparatus according to the embodiment of the disclosure.

Referring to FIG. 1, the laser transfer apparatus 1 according to the embodiment may include the laser oscillator 10 for transferring a plurality of LEDs 40 (see FIG. 7) arranged in a predetermined layout on a transfer substrate 30 (see FIG. 7) to a target substrate 50 (see FIG. 7). The laser transfer apparatus 1 may also include a first stage and a second stage. According to an embodiment, the first stage 21 may be disposed below the laser oscillator 10 while being spaced apart from the laser oscillator 10 at a predetermined interval and may move the transfer substrate in one or more of: an X-axis direction, a Y-axis direction, or a Z-axis direction. According to an embodiment, the second stage 22 may be disposed below the first stage 21 while being spaced apart from the first stage 21 at a predetermined interval and may move the target substrate in one or more of: the X-axis direction, the Y-axis direction, or the Z-axis direction.

According to various embodiments, the first stage 21 may have a specific shape, such as, a substantially ring shape or a rectangular frame shape. That is, the first stage 21 may have a peripheral portion that may grip an edge portion of the transfer substrate 30, and an opening formed at an inner side of the peripheral portion. According to an embodiment, the opening does not interfere with falling of the LEDs 40 arranged on the transfer substrate 30 onto the target substrate 50 positioned below the transfer substrate 30 at the time of irradiation of the transfer substrate 30 with the laser beam.

According to an embodiment, the second stage 22 may have a plate shape. According to an embodiment, the second stage 22 may have a continuous inner side of a peripheral (border) portion. That is, unlike the first state 21, the second stage 22 may not include an opening.

According to an embodiment, the laser oscillator 10 may transfer the LEDs 40 on the transfer substrate 30 to the target substrate 50 by using a laser lift-off method.

Referring to FIG. 2, according to an embodiment, the laser oscillator 10 may include a laser generator 11 that generates a laser beam, an attenuator 13 for attenuating an intensity of the laser beam output from the laser generator, a homogenizer 15 that implements an entirely uniform distribution in the laser beam passing through the attenuator, a mask 17 that limits irradiation with the laser beam passing through the homogenizer to enable irradiation with the laser beam in a predetermined pattern, and a projection lens (P-lens) 19 that reduces a size of the pattern of the laser beam passing through the mask for irradiation of a transfer area of the transfer substrate.

According to an embodiment, a plurality of mirrors for changing a path of the laser beam may be disposed between one or more of: the attenuator 13 and the homogenizer 15, or the homogenizer 15 and the mask 17.

According to an embodiment, the laser generator 11 may be implemented by various types of laser generators such as an excimer laser and an ultraviolet (UV) laser depending on a wavelength of the laser beam.

According to an embodiment, the attenuator 13 and the homogenizer 15 may be disposed on an irradiation path of the laser beam and adjust an intensity of the laser beam output from the laser generator 11.

In a case of using the excimer laser, the homogenizer 15 may homogenize the entire laser beam to make a quality of the laser beam passing through the mask 17 uniform. The homogenizer 15 may enable homogenization by dividing sunlight of which intensity is highly variable into small light sources and overlapping the light sources on a target surface.

According to an embodiment, the mask 17 may have a plurality of slits forming a predetermined pattern. The laser beam may form a predetermined pattern by passing through the plurality of slits of the mask 17. The pattern of the mask 17 may be the same as a transfer pattern.

According to an embodiment, the P-lens 19 collects the patterned laser beam passing through the mask 17 and irradiates the laser beam with the same pattern toward the transfer substrate 30 loaded on the first stage 21. In this case, the pattern of the laser beam irradiating the transfer substrate 30 may correspond to points at which the plurality of LEDs are arranged on the transfer substrate, for example, respective positions of the plurality of LEDs that are positioned above transfer positions.

According to an embodiment, the transfer substrate 30 may be disposed below a P-lens 19 while being spaced apart from the P-lens 19 at a predetermined interval. Once the transfer substrate 30 is irradiated with the laser (e.g., patterned laser) through the P-lens 19, the LEDs 40 arranged on the transfer substrate 30 may be transferred to the target substrate 50 disposed below the transfer substrate 30 while being spaced apart from the transfer substrate 30 at a predetermined interval.

Referring back to FIG. 1, the first stage 21 may be disposed below the laser oscillator 10 at the time of the transfer. Specifically, the first stage 21 may be disposed below the P-lens 19 while being spaced apart from the P-lens 19 at a predetermined interval.

The first stage 21 may move in the X-axis direction, the Y-axis direction, and the Z-axis direction by a first driver. The first stage 21 may move along guide rails vertically intersect each other in the X-axis direction and the Y-axis direction, and may move in the Z-axis direction together with the guide rails.

According to an embodiment, the first stage 21 may be disposed at any position to prevent the laser oscillator 10 from interfering with the transfer substrate 30 at the time of loading and unloading the transfer substrate 30 on and from the first stage 21.

According to an embodiment, the second stage 22 may be disposed below the first stage 21 while being spaced apart from the first stage 21 at a predetermined interval at the time of the transfer.

According to an embodiment, the second stage 22 may move in the X-axis direction, the Y-axis direction, and the Z-axis direction by a second driver. The second stage 22 may move along the guide rails vertically intersect each other in the X-axis direction and the Y-axis direction, and may move in the Z-axis direction together with the guide rails.

According to an embodiment, the second stage 22 may be disposed at any position to prevent the first stage 21 from interfering with the target substrate 50 at the time of loading and unloading the target substrate 50 on and from the second stage 22.

According to an embodiment, the laser transfer apparatus 1 according to the embodiment of the disclosure may include the flatness measurement sensor 60 for measuring the flatness of each of the transfer substrate 30 and the target substrate 50. The flatness measurement sensor 60 may include a first distance measurement sensor for measuring the flatness of the transfer substrate 30, and a second distance measurement sensor for measuring the flatness of the target substrate 50. The first and second distance measurement sensors may each be implemented by one or more laser displacement sensors (e.g., two laser displacement sensors).

According to an embodiment, the first distance measurement sensor may measure a distance from an arbitrarily set reference position to a predetermined point of the transfer substrate 30 in a vertically downward direction. Here, the "predetermined point of the transfer substrate 30" may be a boundary surface 33 between the transfer substrate 30 and an adhesive layer 31 stacked on one surface of the transfer substrate.

In this case, a distance (Z-axis coordinate) corresponding to a position (coordinates on an X-Y plane) of each of the LEDs 40 may be arranged on the transfer substrate 30. As such, the flatness of the transfer substrate 30 may be calculated by using distance values measured with respect to the entire area of the transfer substrate 30 using the first distance measurement sensor. The flatness of the transfer substrate 30 calculated as described above may be stored in the memory.

Figure 3:
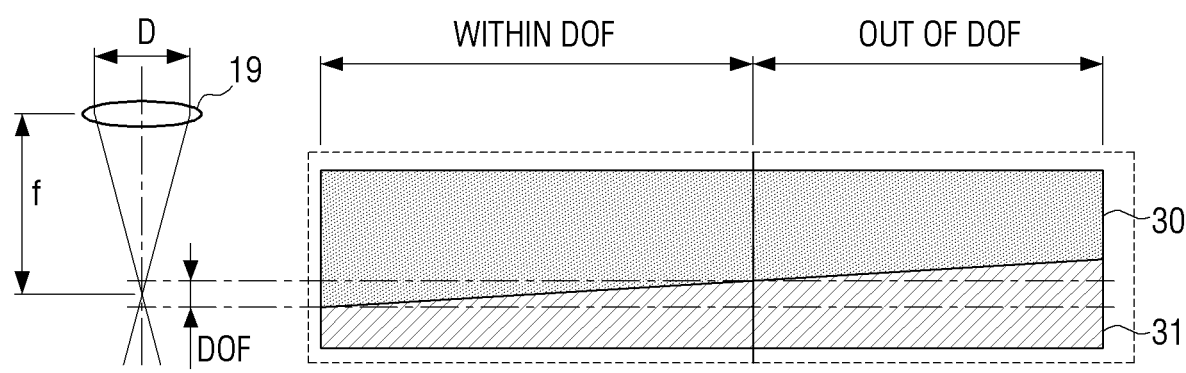
FIG. 3 is a diagram illustrating a range within or out of a DOF of laser for each area of a transfer substrate according to an embodiment of the disclosure.
Figure 4:
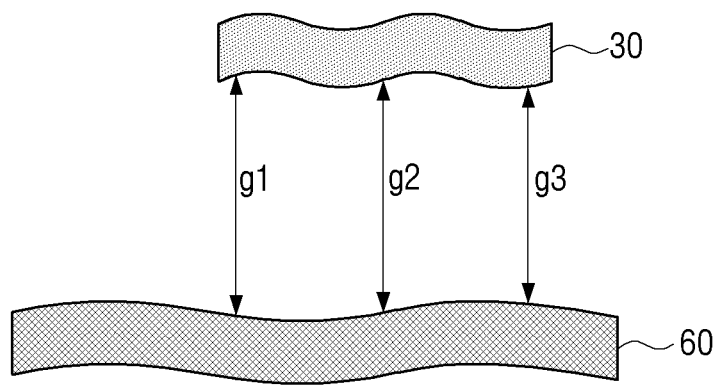
FIG. 4 is a diagram illustrating different intervals between respective points of the transfer substrate and a target substrate, which is caused by low flatness of each of the transfer substrate and the target substrate resulting from a warpage according to an embodiment of the disclosure.

According to an embodiment, the flatness of the transfer substrate 30 may serve as a reference used to calculate a first height adjusting parameter for moving the first stage 21 by an appropriate distance in an +Z-axis direction or −Z-axis direction to position the transfer substrate 30 within the DOF of the laser beam, at a transferring position as illustrated in FIG. 3.

Meanwhile, in a case that a point of the transfer substrate 30 that is irradiated with the laser beam is positioned within the DOF as illustrated in FIG. 3, the LED 40 may be properly separated from the adhesive layer 31. That is, as a portion of the adhesive layer 31 corresponding to one entire surface of the LED 40 attached to the adhesive layer 31 is substantially uniformly melted by the laser beam, the LED 40 may fall in a vertical direction at the time of being separated from the adhesive layer 31, and an anode 41 and a cathode 43 of the LED 40 may be accurately transferred to an anode 51 and a cathode 53 of the target substrate 50, respectively (see FIG. 7). In the disclosure, an expression that the transfer substrate 30 is positioned within the DOF means that the boundary surface 33 between the transfer substrate 30 and the adhesive layer 31 is positioned within the DOF of the laser beam.

Meanwhile, in a case that a point of the transfer substrate 30 that is irradiated with the laser beam is positioned out of the DOF, a part of adhesive layer 31 that is irradiated with the laser beam may be melted, and the other part of the adhesive layer 31 may not be completely melted. As a result, the LED 40 separated from the adhesive layer 31 may fall in an inclined state.

Such a phenomenon may be shown in case that points in time at which opposite sides of the LED 40 attached to the adhesive layer 31 are separated from the adhesive layer 31 are different from each other. That is, in a case that one side of the LED 40 positioned in a completely melted area of the adhesive layer 31 is separated earlier than the other side of the LED 40 positioned in an area of the adhesive layer 31 that is not completely melted, the LED 40 may fall in the inclined state.

As such, in a case that the LED 40 is transferred in the inclined state to the target substrate 50, the LED 40 may not be accurately disposed at a predetermined transfer position. That is, a problem that the anode 41 and the cathode 43 of the LED 40 are not accurately connected to the anode 51 and the cathode 53 of the target substrate 50, respectively, may occur.

According to an embodiment, the second distance measurement sensor may measure a distance from an arbitrarily set reference position to a predetermined point of the target substrate 50 in a vertically downward direction. Here, the "predetermined point of the target substrate 50" may be a surface of the target substrate 50 to which the LED 40 is transferred.

Flatness data obtained by performing measurement on the entire area of the target substrate 50 using the second distance measurement sensor may be stored in the memory. According to an embodiment, the flatness of the target substrate 50 may serve as a reference used to calculate a second height adjusting parameter for moving the second stage 22 by an appropriate distance in the +Z-axis direction or −Z-axis direction to maintain a predetermined interval from the lower side of the transfer substrate 30, at a transferring position.

Intervals g1, g2, and g3 between respective points of the transfer substrate 30 and the target substrate 50 may be different from one another (g1≠g2≠g3) due to the warpage described above, at the transferring positions that are vertically arranged. As such, the second height adjusting parameter may be calculated based on the flatness obtained by using the second distance measurement sensor to compensate for the difference between the intervals g1, g2, and g3 between the respective points of the transfer substrate 30 and the target substrate 50. Such a second height adjusting parameter may be applied to change a height (Z-axis direction) of the second stage 22.

Meanwhile, according to an embodiment, the controller 70 of the laser transfer apparatus 1 may measure positions of the first and second stages 21 and 22 in real time to accurately dispose the substrates at the transferring positions, respectively. In this case, the controller 70 may grasp the positions of the first and second stages 21 and 22 based on the number of revolutions of each of motors that drive the first and second stages 21 and 22, respectively, a driving time, moving speeds of the first and second stages 21 and 22, or the like. Alternatively, according to an embodiment, the laser transfer apparatus 1 may further include a position measurement sensor that measures three-dimensional positions of the first and second stages 21 and 22 in real time.

Further, according to an embodiment, the controller 70 of the laser transfer apparatus 1 may calculate the moving speeds of the first and second stages 21 and 22 based on the number of revolutions of each of the motors that drive the first and second stages 21 and 22, respectively.

Further, the laser transfer apparatus 1 may further include separate first and second speed sensors to measure the moving speeds of the first and second stages 21 and 22 in real time.

According to an embodiment, the first speed sensor may measure the moving speed of the first stage 21 in real time. According to an embodiment, the second speed sensor may measure the moving speed of the second stage 22 in real time.

As such, the moving speeds of the first and second stages 21 and 22 detected by the first and second speed sensors, respectively, in real time may be used to control a laser beam irradiation timing.

That is, the first and second stages 21 and 22 may move along the X-Y plane while moving from transferring positions to the next transferring positions, respectively. Here, the transfer substrate 30 may be moved in the Z-axis direction to be positioned within the DOF of the laser beam at the next transferring position, and the target substrate 50 may also be moved in the Z-axis direction to maintain a predetermined interval from the transfer substrate 30 at the next transferring position.

Therefore, the moving speeds of the first and second stages 21 and 22 may be moving speeds considering both moving speeds of the first and second stages 21 and 22 on the X-Y plane, and moving speeds of the first and second stages 21 and 22 in the Z-axis direction. The laser beam irradiation timing may be calculated based on the moving speeds of the first and second stages 21 and 22.

Meanwhile, the laser transfer apparatus 1 may include first and second position sensors for the first and second stages 21 and 22, respectively. The first position sensor may detect a three-dimensional (3D) position of the first stage 21. The second position sensor may detect a three-dimensional position of the second stage 22. The three-dimensional positions of the first and second stages 21 and 22 may be indicated by three-dimensional coordinates.

According to an embodiment, the controller 70 according to the disclosure may include the memory in which characteristic information of the plurality of LEDs are stored and the processor.

According to an embodiment, the processor may control a general operation of the laser transfer apparatus 1. That is, the processor may be electrically connected to the laser oscillator 10, and the first and second stages 21 and 22 to control each component.

That is, the processor may identify a position on the target substrate 50, to which each of the plurality of LEDs is to be transferred based on the information stored in the memory, may control the movement of the first and second stages 21 and 22 to move the transfer substrate 30 and the target substrate 50 to the transferring positions, respectively, and may control the laser oscillator 10 to irradiate a predetermined point of the transfer substrate 30 with the laser beam at the transferring position.

According to an embodiment, all components may be controlled by a single processor. However, the disclosure is not limited thereto, and the respective components of the laser transfer apparatus 1 may be controlled by using a plurality of independent processors. Here, the processor may include one or more of a central processing unit (CPU), a controller, an application processor (AP), a communication processor (CP), or an Advanced RISC (reduced instruction set computer) Machine (ARM) processor.

According to an embodiment, the memory may be implemented by at least one of a flash memory, a read only memory (ROM), a read only memory (RAM), a hard disk type memory, a multimedia card micro type memory, or a card type memory (for example, a secure digital (SD) memory or an eXtreme digital (XD) memory).

According to an embodiment, the memory may be electrically connected to the processor and transmit and receive a signal and information to and from the processor. The memory stores information obtained by the flatness measurement sensor 60, the position measurement sensor, and the speed measurement sensor, and the processor may access the information stored in the memory.

Hereinafter, a transfer method using the laser transfer apparatus according to the embodiment of the disclosure will be described with reference to the drawings.

Figure 5:
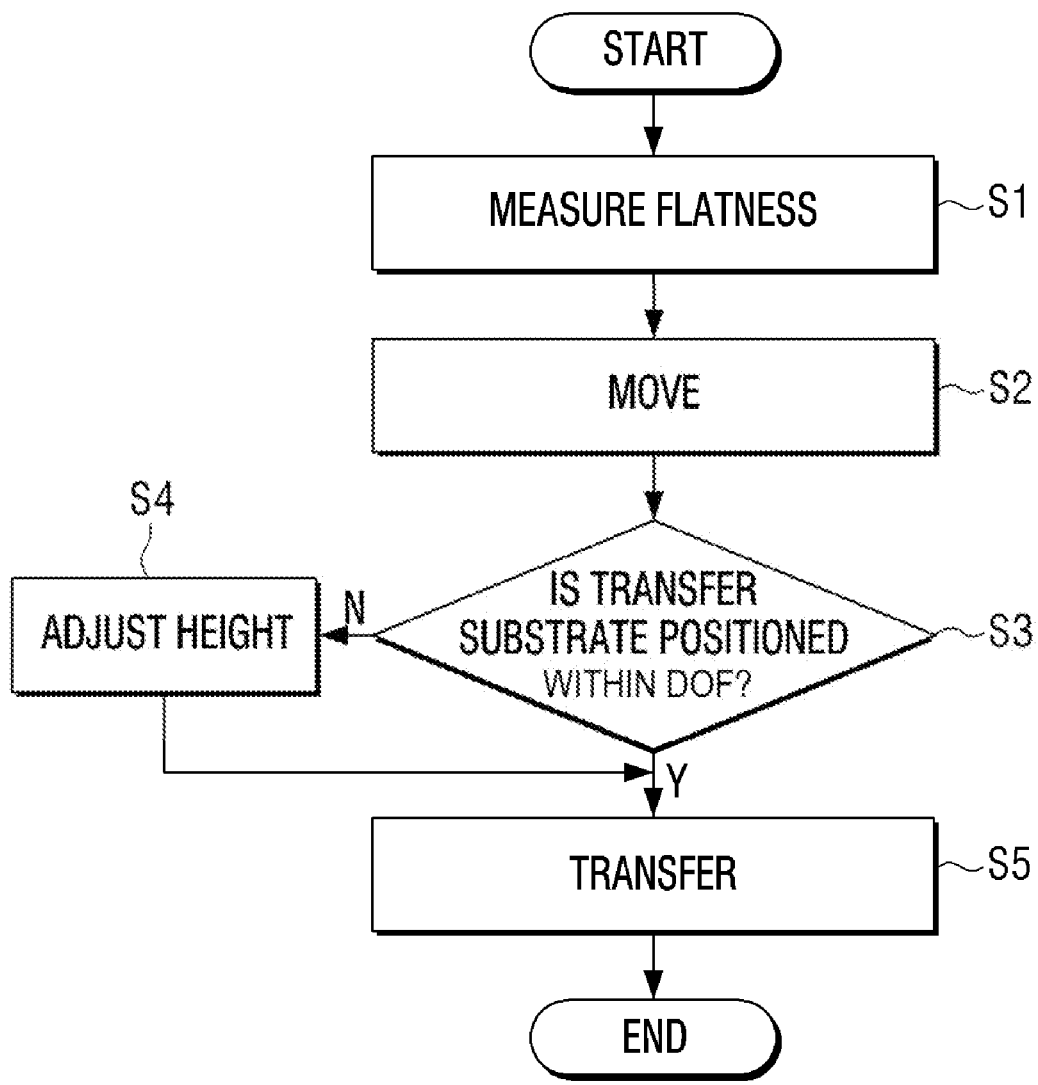
FIG. 5 is a flowchart schematically illustrating a control process of the laser transfer apparatus according to the embodiment of the disclosure.

FIG. 5 is a flowchart schematically illustrating a control process of the laser transfer apparatus according to the embodiment of the disclosure. First, the control process of the laser transfer apparatus according to the embodiment of the disclosure will be schematically described with reference to FIG. 5.

Referring to FIG. 5, flatness of each of the transfer substrate 30 and the target substrate 50 is measured (S1), and then the transfer substrate 30 and the target substrate 50 are moved to transferring positions, respectively (S2).

Whether or not the transfer substrate 30 is positioned within the DOF of the laser beam is identified based on the flatness of the transfer substrate 30 (S3).

Based on identifying that the transfer substrate 30 is positioned within the DOF of the laser beam (S3:YES), the transfer substrate 30 is irradiated with the laser beam to transfer an LED to the target substrate 50 (S5).

Based on identifying that the transfer substrate 30 is not positioned within the DOF of the laser beam (S3:NO), a height of the transfer substrate 30 is adjusted (S4) to position the transfer substrate 30 within the DOF of the laser beam, and then the transfer is performed.

Meanwhile, in the transfer method according to the disclosure, three-dimensional (3D) coordinates corresponding to an appropriate position (e.g., within the DOF) at the time of movement to the transferring positions may be identified based on the flatness measured with respect to each point of the transfer substrate 30 that is to be irradiated with the laser beam, before the transfer substrate 30 and the target substrate 50 are moved to the transferring positions, respectively.

In this case, the transfer substrate 30 and the target substrate 50 may be directly moved to positions where the transfer may be performed, at the same time or in a staggered manner, and the laser beam irradiation timing may be controlled simultaneously with the arrival of the transfer substrate 30 and the target substrate 50 at the transferring positions.

Figure 6:
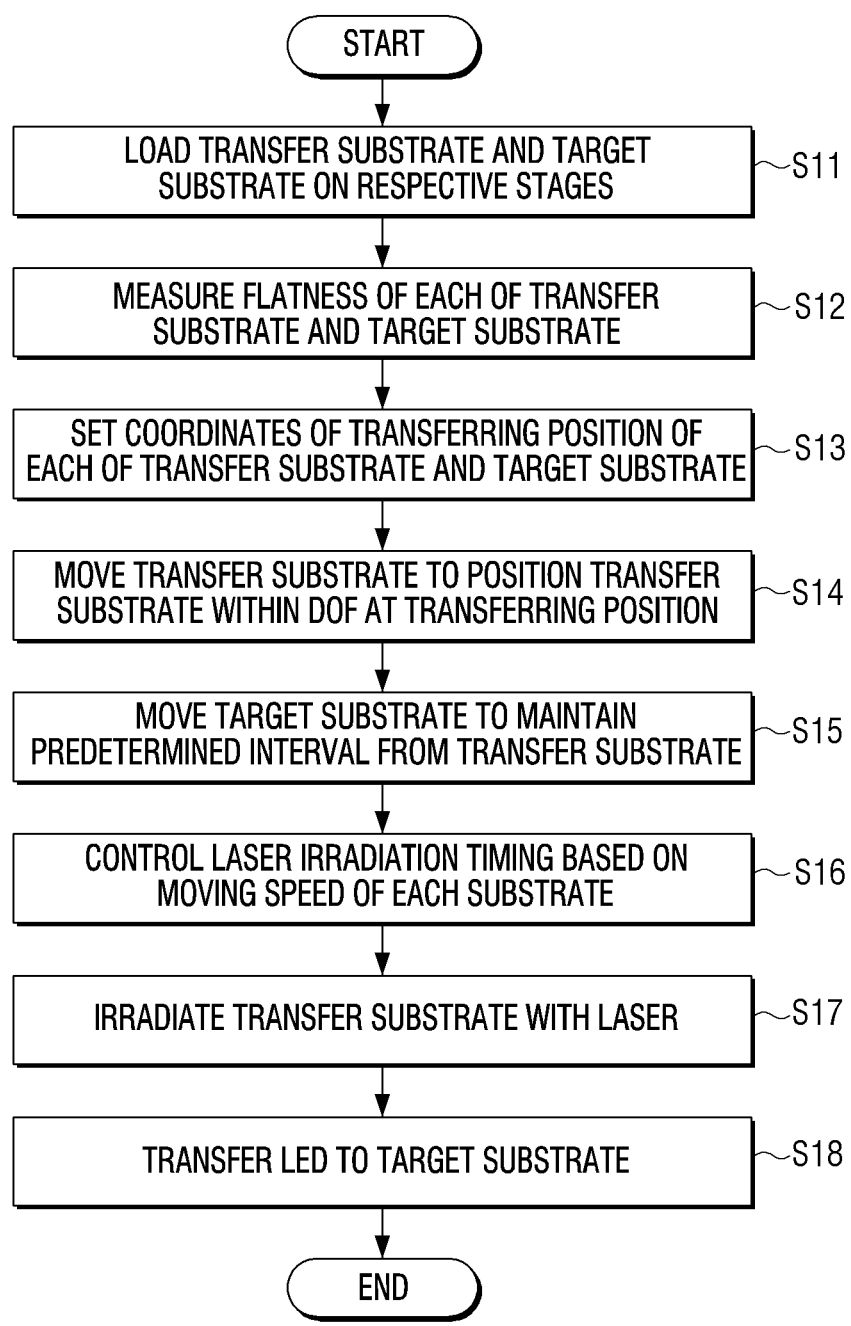
FIG. 6 is a flowchart illustrating an entire control process of the laser transfer apparatus according to the embodiment of the disclosure.
Figure 8:
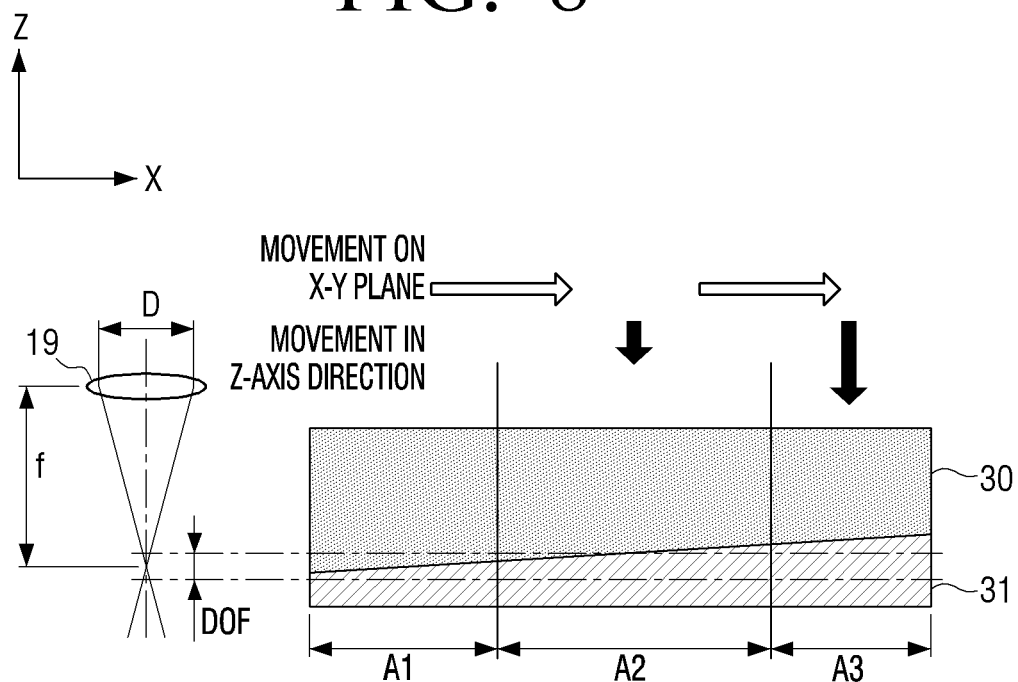
FIG. 8 is a diagram illustrating movement on an X-Y plane and movement in a Z-axis direction to position each area of the transfer substrate within the DOF of the laser with the laser transfer apparatus according to the embodiment of the disclosure.

FIG. 6 is a flowchart illustrating an entire control process of the laser transfer apparatus according to the embodiment of the disclosure; FIG. 7 is a diagram illustrating a process of transferring a plurality of LEDs from the transfer substrate to the target substrate with the laser transfer apparatus according to the embodiment of the disclosure, and FIG. 8 is a diagram illustrating movement on the X-Y plane and movement in the Z-axis direction to position each area of the transfer substrate within the DOF of the laser with the laser transfer apparatus according to the embodiment of the disclosure.

Referring to FIG. 6, the transfer substrate 30 and the target substrate 50 may be loaded on the first stage 21 and the second stage 22, respectively (S11).

According to an embodiment, the transfer substrate 30 loaded on the first stage 21 may be disposed in a form in which the LEDs 40 face the target substrate 50 positioned below the transfer substrate 30. According to an embodiment, the target substrate 50 loaded on the second stage 22 may be disposed in a form in which a TFT layer 52 (see FIG. 7) to which the LEDs 40 are transferred face the transfer substrate 30.

Flatness of the transfer substrate 30 loaded on the first stage 21 and flatness of the target substrate 50 loaded on the second stage 22 may be measured by the flatness measurement sensor 60 (S12), and the measured flatness information may be obtained by the controller/processor of the laser transfer apparatus from the flatness measurement sensor. According to an embodiment, the measured flatness of each of the transfer substrate 30 and the target substrate 50 may be stored in the memory.

According to an embodiment, the controller 70 may set three-dimensional coordinates of a transferring position of each of the transfer substrate 30 and the target substrate 50 (S13). According to an embodiment, the controller 70 may set three-dimensional (3D) coordinates of a transferring position of each of the transfer substrate 30 and the target substrate 50 (S13) based on the measured flatness information.

According to an embodiment, coordinates of the transferring positions on the X-Y plane may be calculated based on pitch information of the plurality of LEDs 40 of the transfer substrate 30, that is stored in the memory in advance, and pitch information of display pixels to be transferred to the target substrate 50, and a coordinate on the Z-axis may be calculated based on the flatness of the transfer substrate 30 and the flatness of the target substrate 50.

Here, according to an embodiment, the display pixels may each include at least two or more sub-pixels with different colors, that is, red/blue sub-pixels, red/green sub-pixels, green/blue sub-pixels, red/blue/green sub-pixels, red/blue/white sub-pixels, red/green/blue/white sub-pixels, red/green/white sub-pixels, or the like.

Then, the first stage 21 may move to the transferring position to position the transfer substrate 30 within the DOF of the laser beam (S14).

According to an embodiment, a point (or portion) of the transfer substrate 30 moved to the transferring position by the first stage 21, at which an LED to be transferred is positioned, may be positioned in a first area A1 within the DOF as illustrated in FIG. 8.

According to an embodiment, after the transfer substrate 30 may be moved to the transferring position, the second stage 22 may move to the transferring position to maintain a predetermined interval between the target substrate 50 and the transfer substrate 30 (S15).

In this case, the controller 70 may predict an arrival time at the first transferring position based on a moving speed of each stage detected by the speed measurement sensor in real time during the movement of each of the first and second stages 21 and 22 from a loading position to the first transferring position. Therefore, the controller 70 may control a timing for irradiation of the transfer substrate 30 with the laser beam from the laser oscillator 10 (S16).

Once the transfer substrate 30 and the target substrate 50 are moved to the transferring positions as illustrated in FIG. 7, the controller 70 may control the laser oscillator 10 to irradiate a plurality of predetermined points of the transfer substrate 30 with the laser beam (S17). In this case, the number of points irradiated with the laser beam need not necessarily be plural, but may be one. The irradiation by the laser beam may occur simultaneously with arrival of the plurality of predetermined points (or one or more of the same) within the DOF. However, the disclosure is not limited to an exact simultaneous irradiation.

According to an embodiment, the transfer substrate 30 may be configured such that the plurality of LEDs 40 disposed at the points of the transfer substrate 30 that are irradiated with the laser beam may be separated from the adhesive layer 31 and accurately transferred to predetermined points of the target substrate 50 (S18).

An anode 41 and a cathode 43 of each of the LEDs 40 transferred to the target substrate 50 may be electrically connected to an anode 51 and a cathode 53 formed on the TFT layer 52 of the target substrate 50, respectively.

Once the transfer at the first transferring position is completed as described above, the controller 70 may control the first and second stages 21 and 22 to move the transfer substrate 30 and the target substrate 50 to the next transferring positions, respectively, as illustrated in FIG. 6.

In a case that a point to be irradiated with the laser beam is positioned in a second area A2 when the transfer substrate 30 arrives at the next transferring position, a partial area of the second area A2 may be within the DOF of the laser beam, and the other area of the second area A2 may be out of the DOF of the laser beam. According to an embodiment, the controller 70 may move one or more of the first stage or the second stage based on the partial area of the second area A2 being within the DOF, and the other area of the second area A2 being out of the DOF of the laser beam. For example, the controller may move the first stage 21 in the Z-axis direction by a predetermined distance to position the entire second area A2 within the DOF of the laser beam.

Further, in a case that a point to be irradiated with the laser beam is positioned in a third area A3 when the transfer substrate 30 arrives at the next transferring position, the entire area of the third area A3 may be out of the DOF of the laser beam. In this case, the controller 70 may move the first stage 21 in the Z-axis direction by a larger distance than that in a case where the third area A3 is within the DOF of the laser beam.

Meanwhile, once the transfer substrate 30 is moved to the next transferring position, the controller 70 may control the second stage 22 to move the target substrate 50 to the next transferring position as illustrated in FIG. 7.

According to an embodiment, the controller 70 may predict an arrival time at the next transferring position based on a moving speed of each stage detected by the speed measurement sensor in real time during the movement of each of the first and second stages 21 and 22 from the first transferring position to the next transferring position, thereby controlling the laser beam irradiation timing of the laser oscillator 10.

As described above, according to the embodiment of the disclosure, it is possible to perform a control to position the transfer substrate within the DOF of the laser beam at the transferring position even in a case that the transfer substrate and the target substrate have poor flatness due to the warpage, and thus the LED may be accurately transferred to a predetermined point of the target substrate.

Further, according to the embodiment of the disclosure, it is possible to predict an arrival time of each substrate by detecting moving speeds of the transfer substrate and the target substrate in real time at a corresponding position, and control a laser beam irradiation timing at each transferring position, and thus a tack time required for the LED transfer process may be reduced.

Meanwhile, the various embodiments of the disclosure described above may be implemented in a computer or a computer readable recording medium using software, hardware, or a combination of software and hardware.

Specifically, programs or computer instructions for the transfer methods according to various embodiments of the disclosure described above may be stored in a computer-readable recording medium, more specifically, a non-transitory computer-readable medium. The programs or computer instructions stored in the non-transitory computer-readable medium allow the specific machine described above to perform the operations according to various embodiments described above in case that the programs or computer instructions are executed by a processor of the specific machine.

The non-transitory computer-readable medium is not a medium that stores data therein for a while, such as a register, a cache, a memory, or the like, but means a medium that semi-permanently stores data therein and is readable by the machine. A specific example of the non-transitory computer-readable medium may include a compact disk (CD), a digital versatile disk (DVD), a hard disk, a Blu-ray disk, a universal serial bus (USB), a memory card, a ROM, or the like.

Although embodiments of the disclosure have been illustrated and described hereinabove, the disclosure is not limited to the abovementioned specific embodiments, but may be variously modified by those skilled in the art to which the disclosure pertains without departing from the gist of the disclosure as disclosed in the accompanying claims. These modifications should also be understood to fall within the scope and spirit of the disclosure.

What is claimed is:

1. A laser transfer apparatus comprising:
   a laser oscillator configured to perform irradiation with a laser beam;
   a first stage movably disposed below the laser oscillator;
   a second stage movably disposed below the first stage;
   a flatness measurement sensor; and
   a controller configured to:
      once a transfer substrate on which a plurality of light emitting diodes (LEDs) are arranged is loaded on the first stage, and a target substrate is loaded on the second stage, control the flatness measurement sensor to measure flatness of the transfer substrate and flatness of the target substrate, the first stage having a first height and the second stage having a second height; and
      adjust at least one of the first height of the first stage or the second height of the second stage based on the flatness of the transfer substrate or the flatness of the target substrate,
      wherein the controller is further configured to adjust the first height of the first stage such that the transfer substrate is positioned within a depth of field (DOF) of the laser beam radiated from the laser oscillator.

2. The laser transfer apparatus as claimed in claim 1, wherein the controller is further configured to:
   move the first and second stages to move the transfer substrate and the target substrate to transferring positions, respectively, and
   predict respective arrival times of the first and second stages at the transferring positions based on moving speeds of the first and second stages, respectively, to control a laser irradiation timing of the laser oscillator.

3. The laser transfer apparatus as claimed in claim 1, wherein the flatness measurement sensor measures the flatness of the transfer substrate by measuring a distance from an arbitrarily set reference position to each of points of the transfer substrate, at which the plurality of LEDs are disposed, and measures the flatness of the target substrate by measuring a distance from the arbitrarily set reference position or another arbitrarily set reference position to each of points of the target substrate, to which the plurality of LEDs are to be transferred.

4. The laser transfer apparatus as claimed in claim 1, wherein the controller is further configured to adjust the first height of the first stage by calculating a relative position of a point of the transfer substrate, to which each of the LEDs is attached, with respect to the depth of field (DOF) of the laser beam radiated from the laser oscillator.

5. The laser transfer apparatus as claimed in claim 1, wherein the controller is configured to calculate three-dimensional (3D) coordinates of a transferring position of each of the first and second stages based on the flatness of the transfer substrate and the flatness of the target substrate and move at least one of the first stage or the second stage based on the 3D coordinates.

6. The laser transfer apparatus as claimed in claim 1, wherein
   the transfer substrate loaded on the first stage is disposed in a form in which the plurality of LEDs face the target substrate positioned below the transfer substrate, and
   the target substrate is loaded on the second stage and disposed in a form in which a thin film transistor (TFT) layer to which the LEDs are transferred face the transfer substrate.

7. A transfer method using a laser transfer apparatus, the transfer method comprising:
   once a transfer substrate and a target substrate are loaded on a first stage and a second stage, respectively, performing control to measure flatness of the transfer substrate and flatness of the target substrate, the first stage having a first height and the second stage having a second height;

moving the first stage and the second stage to transferring positions, respectively;

adjusting at least one of the first height of the first stage or the second height of the second stage based on the flatness of the transfer substrate or the flatness of the target substrate; and transferring a plurality of LEDs arranged on the transfer substrate to the target substrate by irradiating the transfer substrate with a laser, wherein the adjusting the at least one of the first height of the first stage or the second height of the second stage comprises adjusting the first height of the first stage such that the transfer substrate is positioned within a depth of field (DOF) of the laser.

8. The transfer method as claimed in claim 7, further comprising obtaining a first stage height adjusting parameter for positioning a laser irradiation point of the transfer substrate within the depth of field (DOF) of the laser, wherein in the adjusting of the at least one of the first height of the first stage or the second height of the second stage, the first height of the first stage is adjusted based on the first stage height adjusting parameter.

9. The transfer method as claimed in claim 8, further comprising obtaining a second stage height adjusting parameter for maintaining a predetermined interval between a light emitting diode (LED) mounting point of the target substrate, and an LED mounting point of the transfer substrate, wherein in the adjusting of the at least one of the first height of the first stage or the second height of the second stage, the second height of the second stage is adjusted based on the second stage height adjusting parameter.

10. The transfer method as claimed in claim 7, further comprising setting three-dimensional (3D) coordinates of a transferring position of the transfer substrate and the target substrate based on the measured first flatness and the measured second flatness.

11. The transfer method as claimed in claim 7, wherein in the moving of the first stage, the first stage is driven to position a laser irradiation point of the transfer substrate within the depth of field (DOF) of the laser at a transferring position.

12. The transfer method as claimed in claim 7, further comprising predicting arrival times of the first and second stages at the transferring positions based on moving speeds of the first and second stages, respectively, to control a laser irradiation timing.

13. A non-transitory computer-readable recording medium comprising program code, which, when executed by a processor, causes the processor to perform the transfer method as claimed in claim 7.

14. A laser transfer apparatus comprising:
one or more flatness measurement sensors; and
a processor configured to:
obtain, from the one or more flatness measurement sensors, measured flatness information regarding flatness of a wafer and flatness of a target substrate, respectively, wherein the wafer holds a micro light emitting diode (LED) and the target substrate is located below the wafer which is located below an irradiation system; and
set three-dimensional (3D) coordinates of transferring positions of the wafer and the target substrate based on the measured flatness information, wherein a first stage holds the wafer and a second stage holds the target substrate.

15. The laser transfer apparatus as claimed in claim 14, wherein the processor is further configured to: control, based on the flatness of the wafer, a position of the wafer to position each point of an adhesive layer of the target substrate to which a micro LED is attached within a depth of field (DOF) of a laser of the irradiation system.

16. The laser transfer apparatus as claimed in claim 14, wherein the processor is further configured to: control, based on the transferring position of the wafer, a position of the target substrate to maintain a predetermined interval between the target substrate and the wafer.

17. The laser transfer apparatus as claimed in claim 14, further comprising one or more speed sensors configured to detect moving speeds of one or more of the first stage or the second stage, wherein the processor is further configured to:
obtain, from the one or more speed sensors, one or more moving speeds of at least one of the first stage or the second stage, in real time, and
control a laser irradiation timing at which the wafer is to be irradiated with a laser of the irradiation system.

18. The laser transfer apparatus as claimed in claim 14, wherein the wafer loaded on the first stage is disposed in a form in which the LED faces the target substrate positioned below the wafer.

19. The laser transfer apparatus as claimed in claim 14, wherein the target substrate is loaded on the second stage and disposed in a form in which a thin film transistor (TFT) layer to which the LED is transferred face the wafer.

20. The laser transfer apparatus as claimed in claim 14, wherein
the wafer loaded on the first stage is disposed in a form in which the LED faces the target substrate positioned below the wafer, and
the target substrate is loaded on the second stage and disposed in a form in which a thin film transistor (TFT) layer to which the LED is transferred face the wafer.

\* \* \* \* \*